United States Patent
Chung et al.

(10) Patent No.: US 10,535,837 B2
(45) Date of Patent: Jan. 14, 2020

(54) DISPLAY MODULE AND A DISPLAY DEVICE INCLUDING THE SAME

(71) Applicant: SAMSUNG DISPLAY CO., LTD., Yongin-si, Gyeonggi-Do (KR)

(72) Inventors: Yun-mo Chung, Yongin-si (KR); Ilhun Seo, Asan-si (KR); Hojin Yoon, Hwaseong-si (KR); Daewoo Lee, Hwaseong-si (KR); Minseong Yi, Hwaseong-si (KR); Miyeon Cho, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 64 days.

(21) Appl. No.: 15/673,868

(22) Filed: Aug. 10, 2017

(65) Prior Publication Data
US 2018/0138440 A1     May 17, 2018

(30) Foreign Application Priority Data

Nov. 14, 2016    (KR) .......................... 10-2016-0151399

(51) Int. Cl.
| | |
|---|---|
| *H01L 51/52* | (2006.01) |
| *H05K 1/14* | (2006.01) |
| *H01L 23/552* | (2006.01) |
| *H01L 27/32* | (2006.01) |
| *H05K 5/00* | (2006.01) |
| *G06F 3/041* | (2006.01) |

(52) U.S. Cl.
CPC .......... *H01L 51/524* (2013.01); *H01L 23/552* (2013.01); *H01L 27/323* (2013.01); *H01L 51/5253* (2013.01); *H05K 1/148* (2013.01); *H05K 5/0017* (2013.01); *G06F 3/041* (2013.01); *H01L 27/3244* (2013.01); *H01L 2251/5338* (2013.01); *H05K 2201/10128* (2013.01)

(58) Field of Classification Search
CPC . H01L 27/323; H01L 27/3244; H01L 51/524; G06F 1/1652; H05K 1/148; H05K 5/0017
See application file for complete search history.

(56) References Cited

U.S. PATENT DOCUMENTS

| | | | | |
|---|---|---|---|---|
| 10,159,135 | B2 * | 12/2018 | Ikeda | H05B 33/12 |
| 2016/0037608 | A1 * | 2/2016 | Ikeda | H05B 33/12 |
| | | | | 362/235 |

FOREIGN PATENT DOCUMENTS

KR    10-2015-0004255    1/2015

* cited by examiner

*Primary Examiner* — Latanya N Crawford
(74) *Attorney, Agent, or Firm* — F. Chau & Associates, LLC

(57) ABSTRACT

A display module including a display panel, a supporting member, a first circuit board, and a light blocking member. The display panel includes a display area and a non-display area. The non-display area is bent. The supporting member includes a first surface overlapping the display area; a second surface opposite to the first surface; and a third surface configured to connect the first surface to the second surface. The first circuit board faces the second surface and is electrically connected to the non-display area. The light blocking member contacts a bent area of the non-display area.

11 Claims, 13 Drawing Sheets

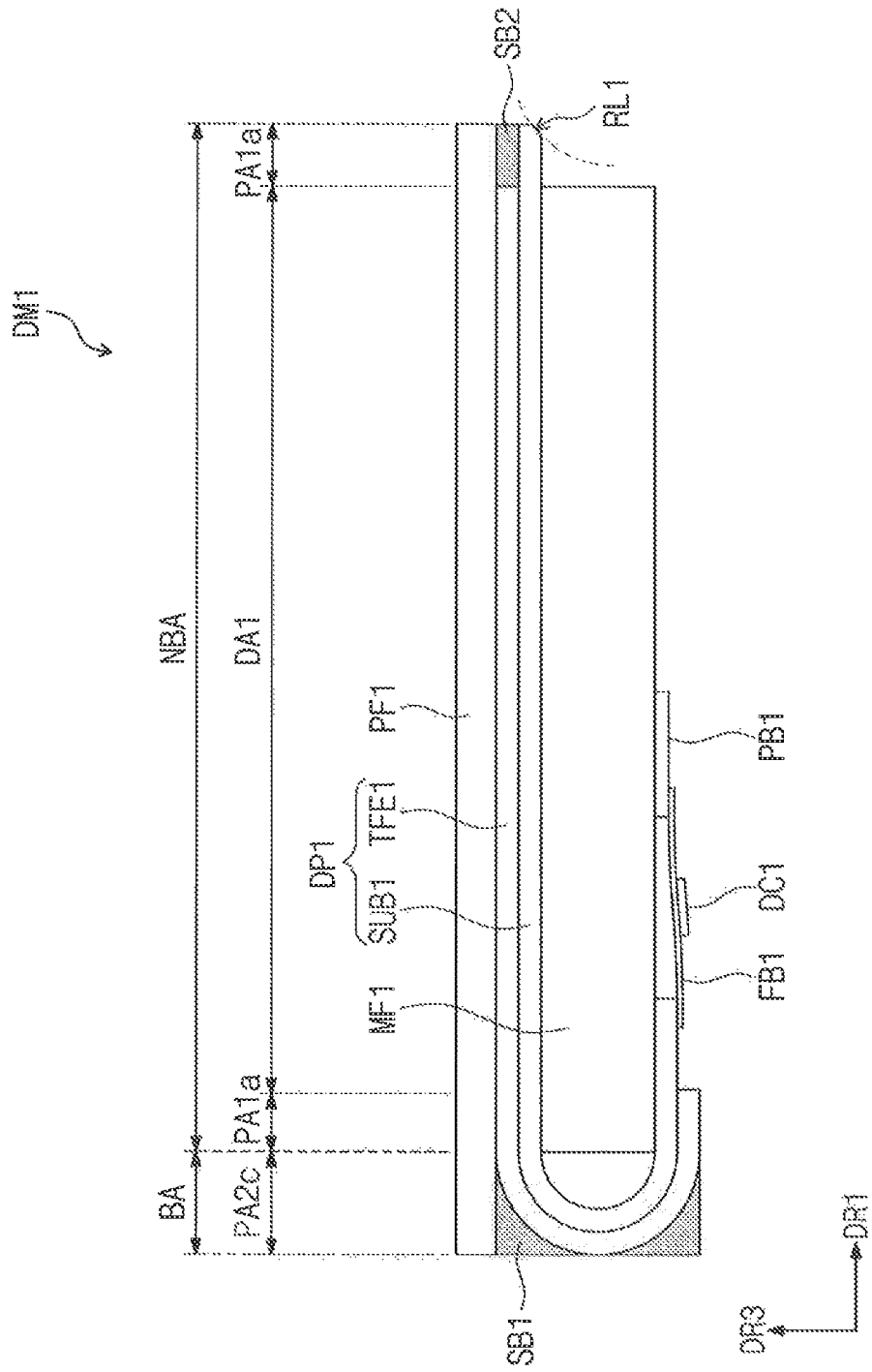

DISPLAY MODULE AND A DISPLAY DEVICE INCLUDING THE SAME

CROSS-REFERENCE TO RELATED APPLICATION

This U.S. non-provisional patent application claims priority under 35 U.S.C. § 119 to Korean Patent Application No. 10-2016-0151399, filed on Nov. 14, 2016 in the Korean Intellectual Property Office, the disclosure of which is incorporated by reference herein in its entirety.

TECHNICAL FIELD

Exemplary embodiments of the present inventive concept relate to a display module, and more particularly to a display device including the same.

DISCUSSION OF RELATED ART

Various display devices such as televisions, mobile phones, tablet computers, navigation devices, and game consoles for use in multimedia devices are being developed. The display devices may include a keyboard or a mouse as an input device. The display devices may include an input sensing member as an input device. For example, a touch screen panel.

Since the display devices may include a plurality of display modules, a large display surface may be made. However, when a large number of display modules are used, image visibility may be poor in a bezel area between the display modules.

SUMMARY

Exemplary embodiments of the present inventive concept provide a display device, in which a non-display area decreases and a display area increases.

Exemplary embodiments of the present inventive concept also provide a display device in which bezel areas between a plurality of display modules may be decreased.

One or more exemplary embodiments of the present inventive concept provide a display module. The display module includes a display panel, a supporting member, a first circuit board, and a light blocking member. The display panel includes a display area and a non-display area. The non-display area is bent. The supporting member includes a first surface overlapping the display area; a second surface opposite to the first surface; and a third surface configured to connect the first surface to the second surface. The first circuit board may face the second surface. The first circuit board may be electrically connected to the non-display area. The light blocking member may contact a bent area of the non-display area.

The non-display area may have a curved area and a flat area. The curved area may be bent from the display area along the third surface. The flat area may extend from the curved area. The flat area may be disposed on the second surface. The light blocking member may contact the curved area.

The display panel may include a base layer, a display layer, and a thin film encapsulation layer. The base layer may include the display area, the curved area, and the flat area. The display layer may be disposed on the base layer. The thin film encapsulation layer may be disposed on the base layer. The thin film encapsulation layer may be configured to cover the display layer.

The thin film encapsulation layer may be disposed on the base layer. The thin film encapsulation layer may overlap display area and the curved area. The light blocking member may overlap the curved area. The light blocking member may contact the thin film encapsulation layer.

The display module may further include a second circuit board. The second circuit board may be configured to electrically connect the display layer to the first circuit board. The second circuit board may have a first end and a second end. The first end may be connected to the flat area. The second end may be connected to the first circuit board.

The non-display area may have a first non-display area and a second non-display area. The first non-display area may be adjacent to the display area. The second non-display area may correspond to the bent area. The display panel may have a first lower surface, a first upper surface, a first side surface, and a curved surface. The first side surface may be configured to connect the first lower surface to the first upper surface. The curved surface may overlap the first non-display area. The curved surface may be configured to connect the first lower surface to the first side surface. The first non-display area may be substantially flat. The first non-display area may partially surround the display area.

The display module may further include a lower chassis. The lower chassis may be configured to receive the display panel and the supporting member. The light blocking member may be disposed in a space between the non-display area and the lower chassis.

The display module may further include a protection film. The protection film may be disposed on the display panel. The protection film may overlap each of the display area and the non-display area.

The display module may further include an input sensing member. The input sensing member may be disposed on the display panel. The input sensing member may overlap the display area.

One or more exemplary embodiments of the present inventive concept provide a display device. The display device includes a first display module and a second display module. The first display module includes a first display area, a first non-display area, and a second non-display area. The first non-display area may be adjacent to the first display area. The second non-display area may be bent from the first non-display area. The second display module may include a second display area, a third non-display area, and a fourth non-display area. The third non-display area may be adjacent to the second display area. The fourth non-display area may be bent from the third non-display area. The first non-display area may overlap the fourth non-display area. The first non-display area may be substantially flat. The first non-display area may partially surround the first display area. The third non-display area may be substantially flat. The third non-display area may partially surround the second display area.

The first display module may include a first display panel. The first display panel may include first upper and lower surfaces overlapping each of the first display area, the first non-display area, and the second non-display area; a first side surface configured to connect the first upper surface and the first lower surface; and a curved surface overlapping the first non-display area and configured to connect the first lower surface and the first side surface. The second display module may include a second display panel. The second display panel may include second upper and lower surfaces overlapping each of the second display area, the third non-display area, and the fourth non-display area; and a second side surface configured to connect the second lower surface and the second upper surface. The curved surface may be disposed on the second upper surface. The curved surface may overlap the fourth non-display area.

The first display module may further include a first light blocking member and a second light blocking member. The first light blocking member may be disposed on the first display panel. The first light blocking member may overlap the second non-display area. The second light blocking member may be disposed on the first display panel. The second light blocking member may overlap the first non-display area. The second display module may further include a third light blocking member. The third light blocking member may be disposed on the second display panel. The third light blocking member may overlap the third non-display area.

The display device may further include a fourth light blocking member. The fourth light blocking member may be disposed on the second display panel. The fourth light blocking layer may overlap a portion of the fourth non-display area. The fourth light blocking member might not overlap the second light blocking member.

The first display module may further include a first supporting member. The first supporting member may overlap the first display area. The first supporting member may be configured to support the first display panel. The second display module may further include a second support member. The second support member may overlap the second display area. The second support member may be configured to support the second display panel.

The first display module may further include a first circuit board. The first circuit board may be disposed on a lower surface of the first supporting member. The first circuit board may be connected to the first display panel overlapping the second non-display area. The second display module may further include a second circuit board. The second circuit board may be disposed on a lower surface of the second supporting member. The second circuit board may be connected to the second display panel overlapping the fourth non-display area.

The first display module may further include a first protection film. The first protection film may be disposed on the first display panel. The first protection film may overlap each of the first display area, the first non-display area and the second non-display area. The second display module may further include a second protection film. The second protection film may be disposed on the second panel. The second protection film may overlap each of the second display area and the third non-display area.

The first protection film may be disposed above the second protection film in a thickness direction of the first display panel and the second display panel.

The display device may further include an adhesion member and a window member. The adhesion member may be disposed on each of the first protection film and the second protection film. The window member may be disposed on the adhesion member.

The adhesion member overlapping the first protection film may have a thickness different from a thickness of the adhesion member overlapping the second protection member.

The first display module may further include a first input sensing member. The first input sensing member may be disposed on the first display area. The second display module may further include a second input sensing member. The second input sensing member may be disposed on the second display area.

BRIEF DESCRIPTION OF THE DRAWINGS

The above and other features of the present inventive concept will become more apparent by describing in detail exemplary embodiments thereof, with reference to the accompanying drawings, in which:

FIG. 7A is a cross-sectional view illustrating a first display module according to an exemplary embodiment of the present inventive concept;

DETAILED DESCRIPTION OF THE EMBODIMENTS

Figure 1A:
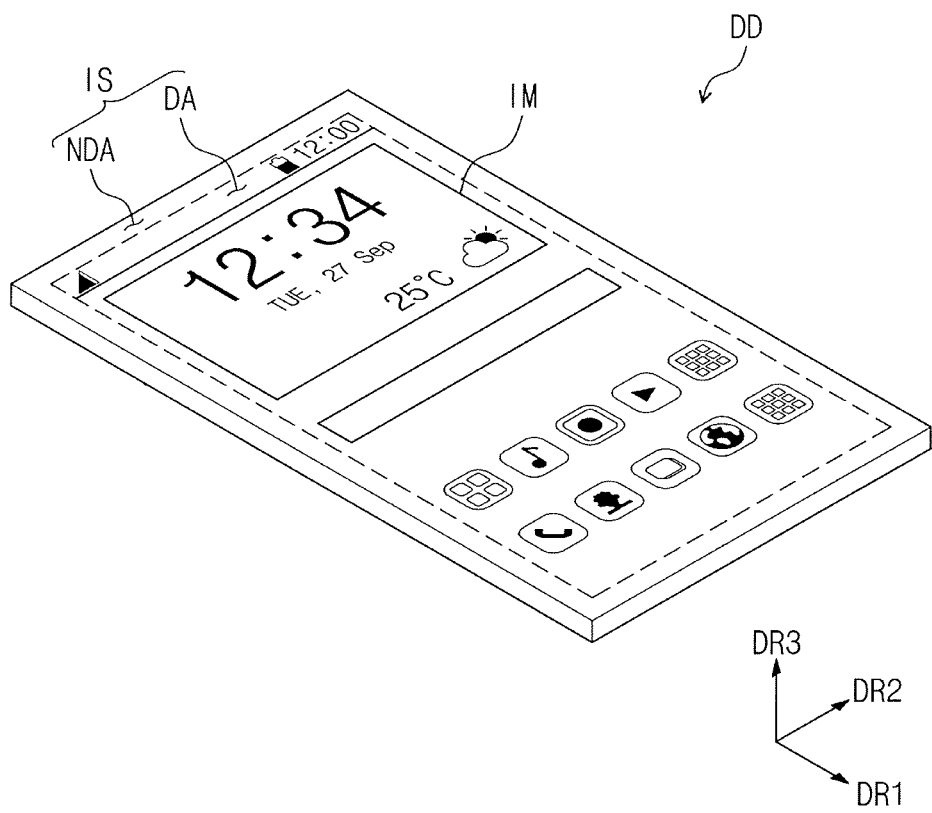
FIG. 1A is a perspective view illustrating a display device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments described herein.

Like reference numerals may refer to like elements through the specification and drawings.

Sizes of elements in the drawings may be exaggerated for clarity.

Figure 1B:
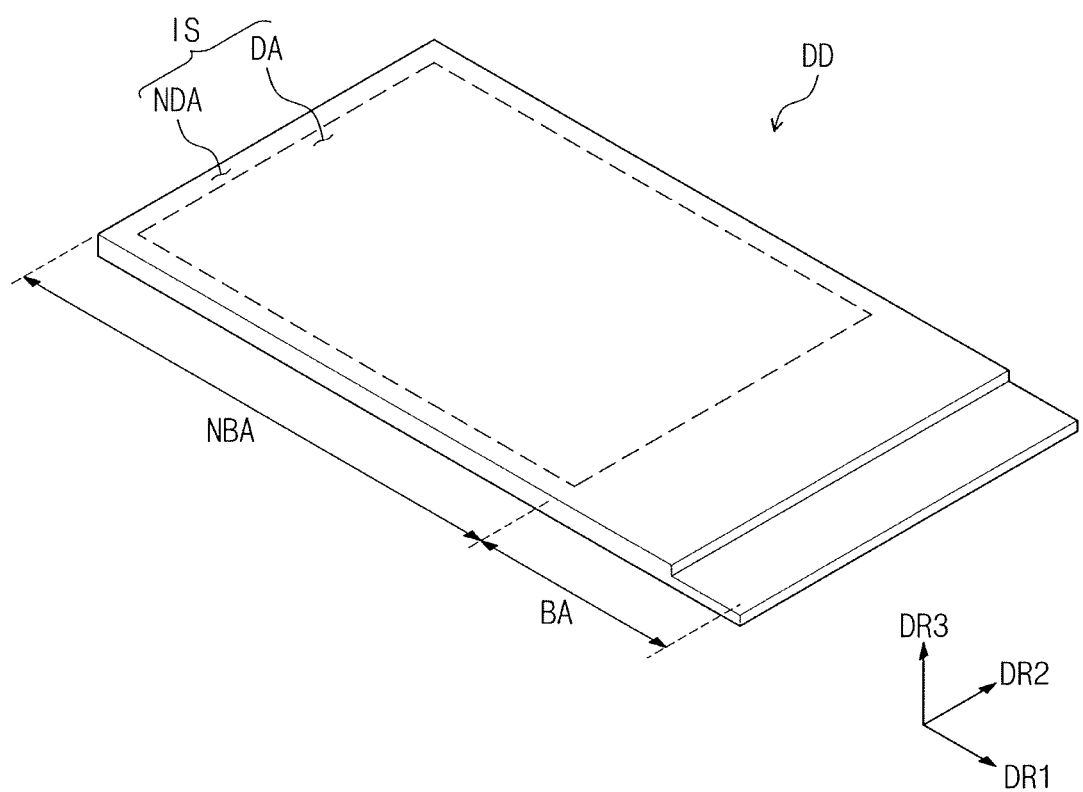
FIG. 1B is a perspective view illustrating a first operation of a display device according to an exemplary embodiment of the present inventive concept.
Figure 1C:
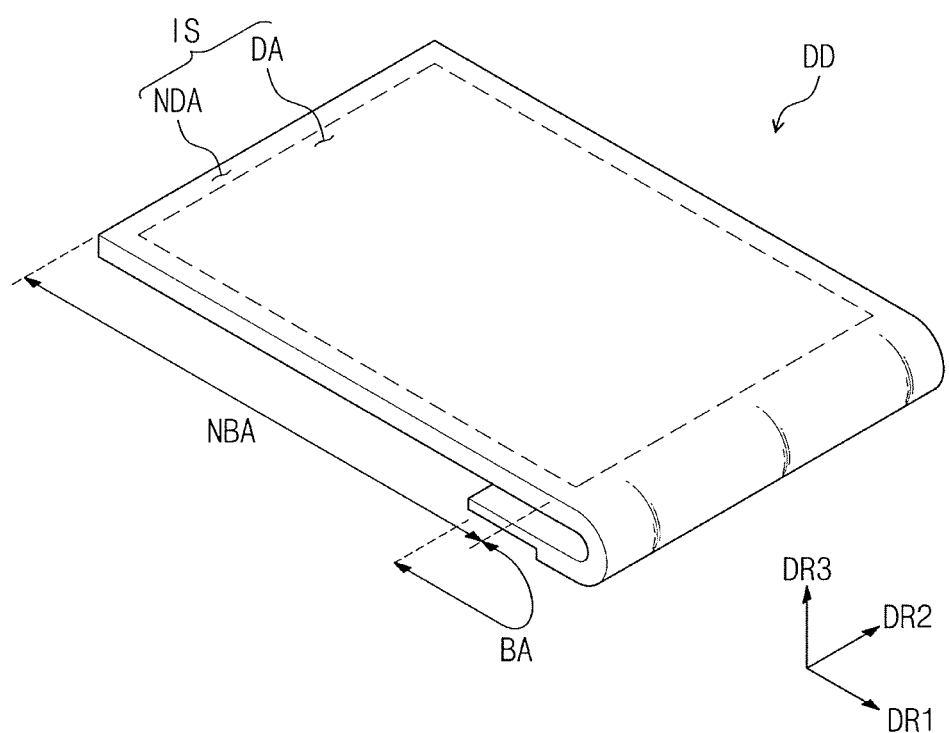
FIG. 1C is a perspective view illustrating a second operation of a display device according to an exemplary embodiment of the present inventive concept.

FIG. 1A is a perspective view illustrating a display device according to an exemplary embodiment of the present inventive concept. FIG. 1B is a perspective view illustrating a first operation of a display device according to an exemplary embodiment of the present inventive concept. FIG. 1C is a perspective view illustrating a second operation of a display device according to an exemplary embodiment of the present inventive concept.

A display device DD according to an exemplary embodiment of the present inventive concept may be included in a smart phone. However, exemplary embodiments of the present inventive concept are not limited thereto. For example, the display device DD may be included in electronic devices such as televisions, personal computers, laptop computers, navigation units for vehicles, game consoles, acoustic electronic devices, smart watches, and cameras. These devices are provided as examples, and thus the display device DD may be included in other electronic devices.

Referring to FIG. 1A, an image surface IS may be substantially parallel to a surface defined by a first direction DR1 and a second direction DR2. The image surface IS is a surface on which an image IM is displayed. The image surface IS may also be referred to as a display surface IS hereinafter. A normal direction of the display surface IS is a third direction DR3. The normal direction of the display surface IS is a thickness direction of the display device DD. Each of the display device DD and the image surface IS may have a front surface (e.g., an upper surface) and a rear surface (e.g., a lower surface) separated from each other in the third direction DR3. However, exemplary embodiments of the present inventive concept are not limited thereto and the first to third directions DR1, DR2, and DR3 may be variously changed.

The display surface IS of the display device DD may include a plurality of areas. The display device DD may include a display area DA and a non-display area NDA. The image IM may displayed on the display area DA. The non-display area NDA may be adjacent to the display area DA. The non-display area NDA may be an area on which the image IM is not displayed. Referring to FIG. 1, the image IM may include, for example, application icons and a watch window. The display area DA may have a tetragonal shape. The non-display area NDA may surround the display area DA; however, exemplary embodiments of the present inventive concept are not limited thereto. For example, shapes of each of the display area DA and the non-display area NDA may vary.

The display device DD may include a window and a protection cover. The window may be configured to provide the display surface IS. The protection cover may be affixed to the window. The protection cover may cover the display device DD. The window may be affixed to a display panel. An inner side of the protection cover may be configured to receive the display panel. The window may be a glass substrate or a plastic substrate. The protection cover may be a plastic assembly, a metal assembly, or a plastic-metal assembly.

Referring to FIGS. 1B and 1C, the display device DD according to an exemplary embodiment of the present inventive concept may include a non-bending area NBA and a bending area BA. FIG. 1B illustrates an unbent shape of the display device DD. FIG. 1C illustrates a bent shape of the display device DD.

According to an exemplary embodiment of the present inventive concept, the bending area BA may be positioned at the non-display area NDA of the display device DD. In other words, in the display device DD according to an exemplary embodiment of the present inventive concept, since the non-display area NDA overlapping the bending area BA is bent from an edge of the display area DA, the non-display area NDA that is seen from the outside may substantially decrease. This will be described in more detail below with reference to FIG. 4.

Figure 2:
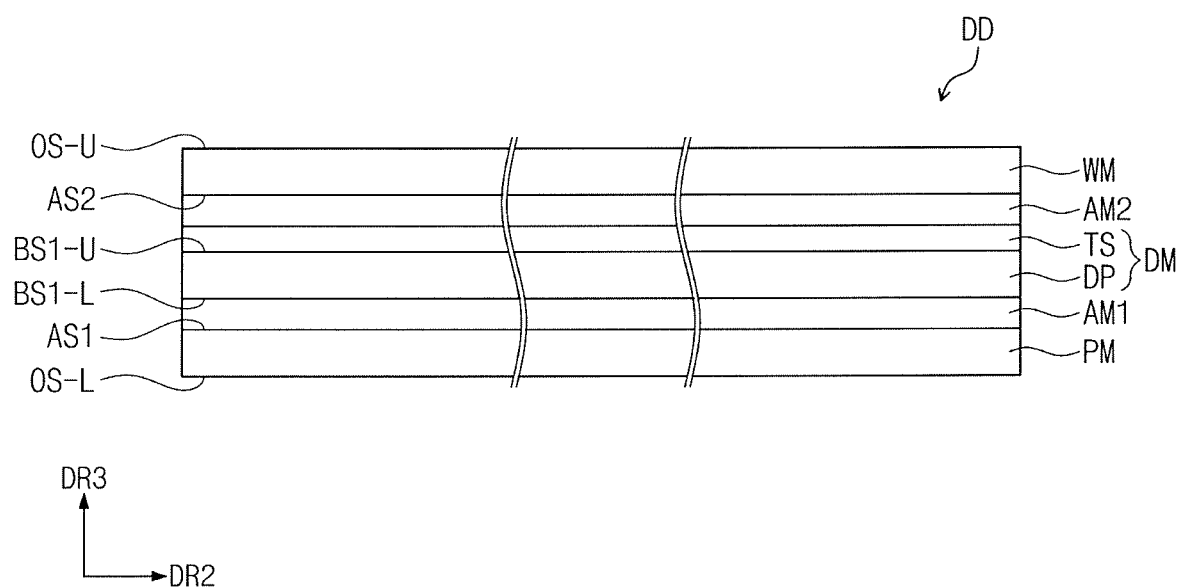
FIG. 2 is a cross-sectional view illustrating a display device according to an exemplary embodiment of the present inventive concept.
Figure 3A:
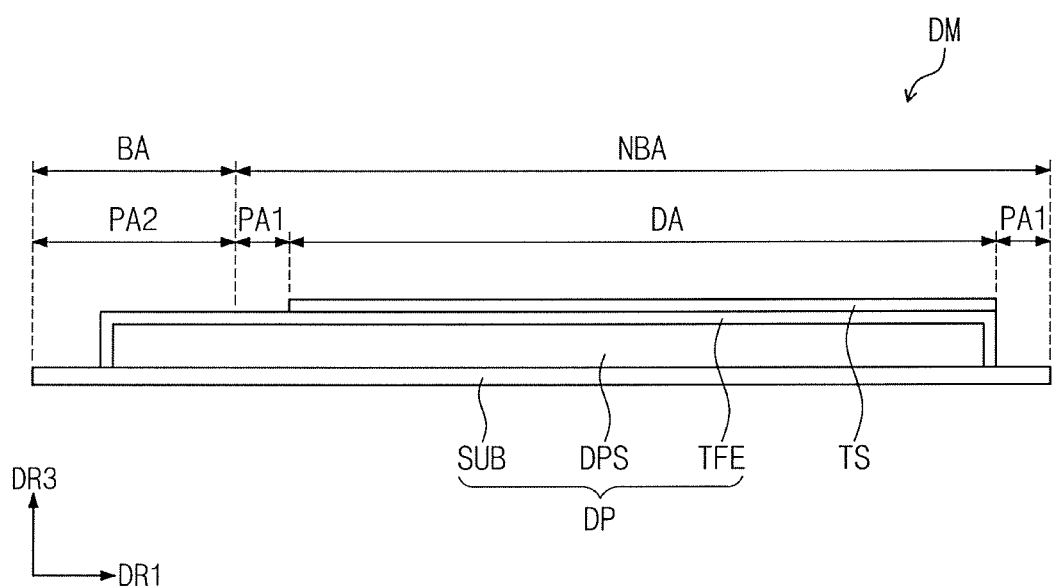
FIG. 3A is a cross-sectional view illustrating a display panel and an input sensing member according to an exemplary embodiment of the present inventive concept.
Figure 3B:
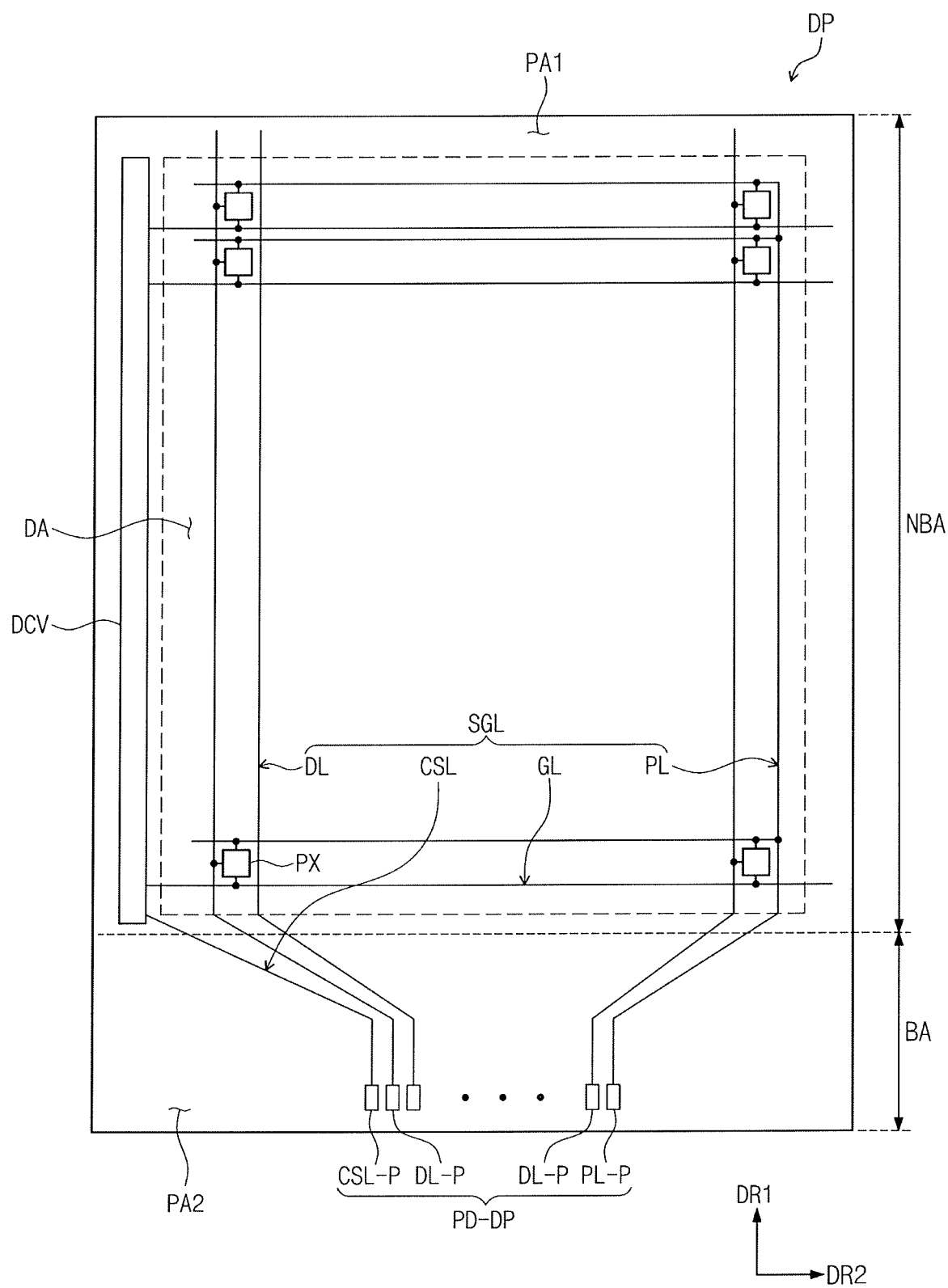
FIG. 3B is a plan view illustrating a display panel according to an exemplary embodiment of the present inventive concept.
Figure 3C:
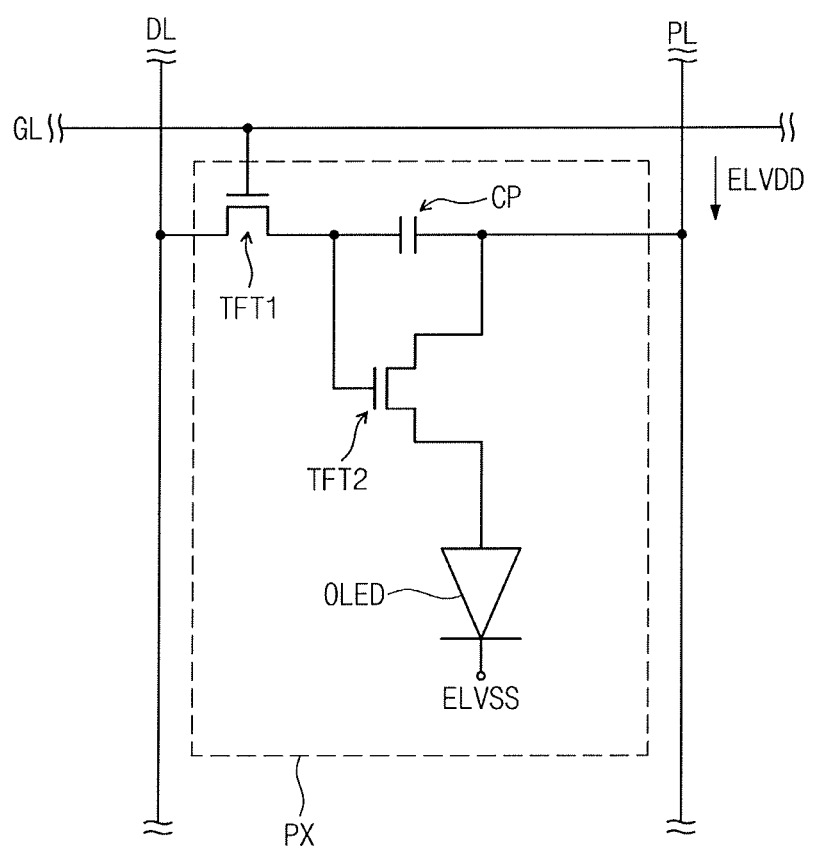
FIG. 3C is an equivalent circuit diagram of a pixel according to an exemplary embodiment of the present inventive concept.

FIG. 2 is a cross-sectional view illustrating a display device according to an exemplary embodiment of the present inventive concept. FIG. 3A is a cross-sectional view illustrating a display panel and an input sensing member according to an exemplary embodiment of the present inventive concept. FIG. 3B is a plan view illustrating a display panel according to an exemplary embodiment of the present inventive concept. FIG. 3C is an equivalent circuit diagram illustrating a pixel according to an exemplary embodiment of the present inventive concept.

Referring to FIG. 2, the display device DD is illustrated in a second direction DR2 and a third direction DR3. The display device DD may include a protection member PM, a window WM, a display module DM, a first adhesion member AM1, and a second adhesion member AM2. The display module DM is disposed between the protection member PM and the window WM. The first adhesion member AM1 couples the display module DM and the protection member PM. The second adhesion member AM2 couples the display module DM and the window WM. According to an exemplary embodiment of the present inventive concept, the first adhesion member AM1 and the second adhesion member AM2 may be omitted. Each of the protection member PM and the window WM may be successively disposed, for example, through a coating process.

The protection member PM may protect the display module DM. The protection member PM may have a first outer surface OS-L and a first adhesion surface AS1. The first outer surface OS-L may be exposed to the outside and a first adhesion surface AS1 may be adhered to the first adhesion member AM1. Hereinafter, the adhesion surface AS1 of the protection member PM is referred to as a first adhesion surface AS1 to differentiate from adhesion surfaces of the other members. The protection member PM may prevent outside moisture from entering the display module DM. The protection member PM may also absorb external impact to the display device DD.

The protection member PM may include a plastic film, for example, as a base layer. The protection member PM may include polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), poly(aryleneether sulfone), or any combination thereof.

A material included in the protection member PM is not limited to a plastic resin. For example, the protection member PM may include an organic/inorganic composite material. The protection member PM may include a porous organic layer. An inorganic substance may be disposed on and/or filled into the organic layer. The protection member PM may further include a functional layer. The functional layer may be disposed on a plastic film. The functional layer may include a resin layer. The functional layer may be disposed through a coating method.

The window WM may protect the display module DM, for example, from an external impact to the display device DD. The window WM may provide the display surface IS of FIG. 1A to be seen by a user. The window WM may have a second outer surface OS-U and a second adhesion surface AS2. The second outer surface OS-U may be exposed to the outside, for example, corresponding to the display surface IS. The adhesion surface AS2 may be adhered to the second adhesion member AM2. Hereinafter, the adhesion surface AS2 of the window WM is referred to as a second adhesion surface AS2 to differentiate from adhesion surfaces of the other members.

The display module DM may includes a display panel DP and an input sensing member TS. The display panel DP and the input sensing member TS may be one body obtained through successive processes. The display panel DP may generate the image IM of FIG. 1A corresponding to an input image data. The display panel DP may have a first display panel surface BS1-L and a second display panel surface BS1-U. The first display panel surface BS1-L and the second display panel surface BS1-U may face each other, for example, in the third direction DR3.

According to an exemplary embodiment of the present inventive concept, the display panel DP may be an organic light-emitting diode display panel, a liquid crystal display panel, a plasma display panel, an electrophoretic display panel, a microelectromechanical system (MEMS) display panel, or an electrowetting display panel.

The display panel DP according to an exemplary embodiment of the present inventive concept will be described as an organic light-emitting diode display panel; however, exemplary embodiments of the present inventive concept are not limited thereto. For example, various display panels may be applied to the exemplary embodiments discussed herein.

The input sensing member TS may obtain coordinate information, for example, from an external input. The input sensing member TR may be disposed directly on the second display panel surface BS1-U. The touch panel TS may be provided with the display panel DP through an additional process.

The display module DM may further include a reflection preventing layer. The reflection preventing layer may include a color filter, a laminated structure, or an optical member. The laminated structure may have a multi-layered structure. For example, the laminated structure may have a conductive layer/a dielectric layer/a conductive layer structure. Since the reflection preventing layer may absorb, destructively interfere, or polarize light incident from the outside, the external light reflectivity of the display device DD may decrease.

Each of the first adhesion member AM1 and the second adhesion member AM2 may be an optically clear adhesive film (OCA), an optically clear resin (OCR), or a pressure sensitive adhesive film (PSA). Each of the first adhesion member AM1 and the second adhesion member AM2 may include a light-curable adhesive material or a heat-curable adhesive material; however, exemplary embodiments of the present inventive concept are not limited thereto.

Referring to FIG. 3A, a display panel DP may include a base layer SUB, a display layer DPS, and a thin film encapsulation layer TFE. The display layer DPS may be disposed on the base layer SUB.

A display area DA and a non-display area NDA may be defined in the base layer SUB. The non-display area NDA may be adjacent to the display area DA. The display area DA and the non-display area NDA defined in the base layer SUB may each be substantially the same as the display area DA and the non-display area NDA of the display device DD of FIG. 1. However, the display area DA and the non-display area NDA in the base layer SUB may be variously modified, for example, according to a structure or a design of the display panel DP. Hereinafter, the display area DA and the non-display area NDA defined in the base layer SUB to be described in more detail below are substantially the same as the display area DA and the non-display area NDA of the display device DD of FIG. 1A.

According to an exemplary embodiment of the present inventive concept, the non-display area NDA of the base layer SUB may include a flat surrounding area PA1 and a bending surrounding area PA2. The flat surrounding area PA1 may be substantially flat. The flat surrounding area PA1 may be adjacent to the display area DA. The bending surrounding area PA2 may be adjacent to the flat surrounding area PA1. The flat surrounding area PA1 may be adjacent to the display area DA. The flat surrounding area PA1 may surround the display area DA; however, exemplary embodiments of the present inventive concept are not limited thereto. For example, the flat surrounding area PA1 may be adjacent to a portion of the display area DA. Alternatively, the flat surrounding area PA1 may be omitted. Thus, the flat surrounding area PA1 may be variously modified, for example, depending on the display device DD.

The bending surrounding area PA2 may substantially correspond to a bending area BA. The bending surrounding area PA2 may include a pad area. The pad area may extend from one area of the flat surrounding area PA1. The pad area may be connected to an external circuit board or the like. For example, the bending surrounding area PA2 may be bent from the flat surrounding area PA1. Alternatively, the bending surrounding area PA2 may be bent from the display area DA. When the bending surrounding area PA2 is bent from the display area DA, the flat surrounding area PA1 disposed between the bending surrounding area PA2 and the display area DA may be omitted.

The base layer SUB may include at least one plastic film. The base layer SUB may be a flexible substrate. The base layer SUB may include a plastic substrate, an organic/inorganic composite substrate, or the like.

The display layer DPS may be disposed on the base layer SUB. The display layer DPS may include a circuit layer and a light-emitting device layer. The circuit layer may overlap the display area DA. The circuit layer may also overlap the non-display area NDA. The light-emitting device layer may overlap the display area DA.

The circuit layer may include a plurality of insulation layers, a plurality of conductive layers, and a semiconductor layer. The plurality of conductive layers may be signal lines and a circuit part of a pixel. The light-emitting device layer may include a plurality of organic light-emitting diodes (OLED).

The thin film encapsulation layer TFE may seal the display layer DPS. The thin film encapsulation layer TFE may have a multi-layered structure. The thin film encapsulation layer TFE may include an inorganic layer and an organic layer. The thin film encapsulation layer TFE may include at least two inorganic layers and an organic layer. The organic layer may be disposed between the inorganic layers. The inorganic layers may protect the light-emitting device layer, for example, from outside moisture or oxygen. The organic layer may protect the light-emitting device layer from foreign materials such as dust particles. The inorganic layer may include a nitride layer, a silicon oxynitride layer and a silicon oxide layer, a titanium oxide layer, an aluminum oxide layer, or the like. The organic layer may include an acryl-based organic layer; however, exemplary embodiments of the present inventive concept are not limited thereto.

According to an exemplary embodiment of the present inventive concept, an input sensing member TS may have a single layered structure. Accordingly, the input sensing member TS may include a single conductive layer. The single conductive layer may be an insulation layer. A laminated structure having a first metal layer/a second metal layer/a metal oxide layer structure may correspond to the single conductive layer. A laminated structure having a first metal layer/an insulation layer/a metal oxide layer structure may correspond to dual conductive layers.

A plurality of touch electrodes and a plurality of touch signal lines may be disposed through patterning the single conductive layer. Thus, the input sensing member TS may include sensors disposed on the same layer. The sensors may be disposed on the thin film encapsulation layer TFE. A portion of each touch signal line may be disposed on the same layer as the sensors. A portion of each touch signal line may be disposed on the circuit layer.

The touch signal lines and the sensors may each include indium tin oxide (ITO), indium zinc oxide (IZO), zinc oxide (ZnO), indium tin zinc oxide (ITZO), PEDOT, a metal nano wire, or graphene. The touch signal lines and the sensors may each include a metal layer, for example, molybdenum, silver, titanium, copper, aluminum, or an alloy thereof. The touch signal lines and the sensors may each include substantially the same material as each other. Alternatively, the touch signal lines and the sensors may include materials different from each other.

Although the input sensing member TS may be the single conductive layer; exemplary embodiments of the present inventive concept are not limited thereto. Thus, the input sensing member TS may include a plurality of conductive layers.

Referring to FIGS. 3B and 3C, the display panel DP may include a plurality of signal lines SGL and a plurality of pixels PX. An area on which the plurality of pixels PX are disposed is referred to as the display area DA. For example, the first flat surrounding area PA1 may be positioned along edges of the display area DA.

The plurality of signal lines SGL may include gate lines GL, data lines DL, a power line PL, and a control signal line CSL. Each of the gate lines GL may be connected to the corresponding pixel of the plurality of pixels PX. Each of the data lines DL may be connected to the corresponding pixel of the plurality of pixels PX. The power line PL may be connected to the plurality of pixels PX. A gate driving circuit DCV may be disposed on a side of the first flat surrounding area PA1. The gate driving circuit DCV may be connected to the gate lines GL. The control signal line CSL may provide control signals, for example, to the gate driving circuit DCV.

Some portions of each of the gate lines GL, the data lines DL, the power line PL, and the control signal line CSL may be disposed on the same layer. Other portions of the gate lines GL, the data lines DL, the power lines PL, and the control signals CSL may be disposed on different layers from each other. Signal lines disposed on one layer of the gate lines GL, the data lines DL, the power line PL, and the control signal line CSL may be referred to as a first signal line. Signal lines disposed on another layer may be referred to as a second signal line. Signal lines disposed on another layer may be defined as a third signal line.

Each of the data lines DL, the power line PL, and the control signal line CSL may include a signal wiring part and lower pads PD-PD. The lower pads PD-PD may be connected to ends of the signal wiring part. A portion of each of the signal wiring part and the lower pads PD-DP may overlap the bending surrounding area PA2. The signal wiring part may be portions except for the lower pads PD-DP of each of the data lines DL, the power line PL, and the control signal line CSL.

The lower pads PD-DP may include a control pad CSL-P, a data pad DL-P, and a power pad PL-P. The gate pad part may overlap the gate driving circuit DCV. The gate pad part may be connected to the gate driving circuit DCV. A portion of the bending surrounding area PA2, in which the control pad CSL-P, the data pad DL-P, and the power pad PL-P are aligned, may be a pad area.

Referring to FIG. 3C, a pixel PX may be connected to one gate line GL, one data line DL, and the power line PL. However, a configuration of the pixel PX is not limited thereto. For example, the configuration of the pixel PX maybe variously modified.

The pixel PX may include an OLED, for example, as a display element. The OLED may be a top-light emitting diode or a bottom-light emitting diode. The pixel PX may be a circuit, for example, to drive the OLED. The pixel PX may include a first transistor TFT1 (e.g., a switching transistor), a second transistor TFT2 (e.g., a driving transistor), and a capacitor CP. The OLED may generate light, for example, by an electrical signal provided from the transistors TFT1 and TFT2.

The first transistor TFT1 may respond to a scanning signal applied to the gate line GL. The first transistor TFT1 may output a data signal applied to the data line DL. The capacitor CP may charge a voltage, for example, corresponding to the data signal received from the first transistor TFT1.

The second transistor TFT2 may be connected to the OLED. The second transistor TFT2 may respond to a quantity of electric charge stored in the capacitor CP. The second transistor TFT2 may control a driving current of the OLED. The OLED may emit light, for example, while the second transistor TFT2 turns ON.

Figure 4:
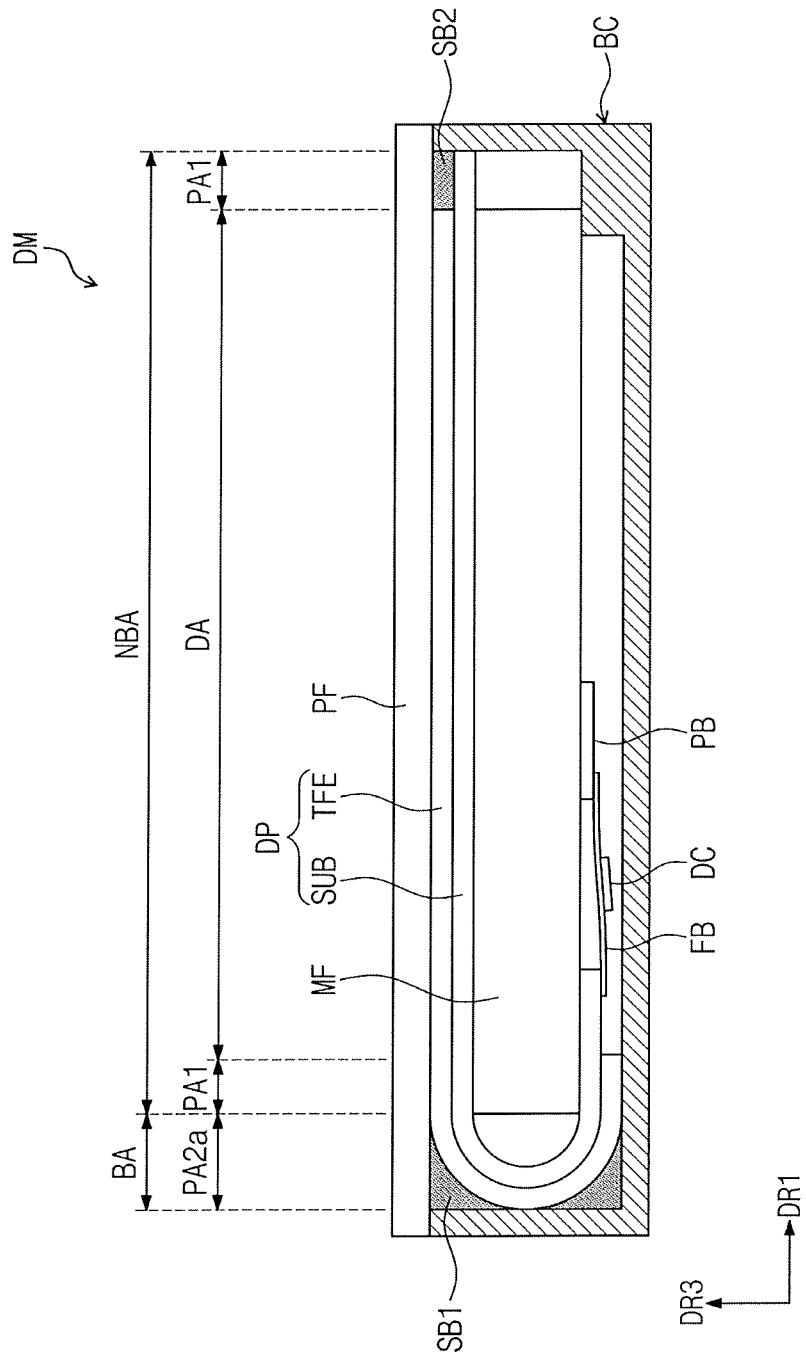
FIG. 4 is a cross-sectional view illustrating a display module according to an exemplary embodiment of the present inventive concept.
Figure 5:
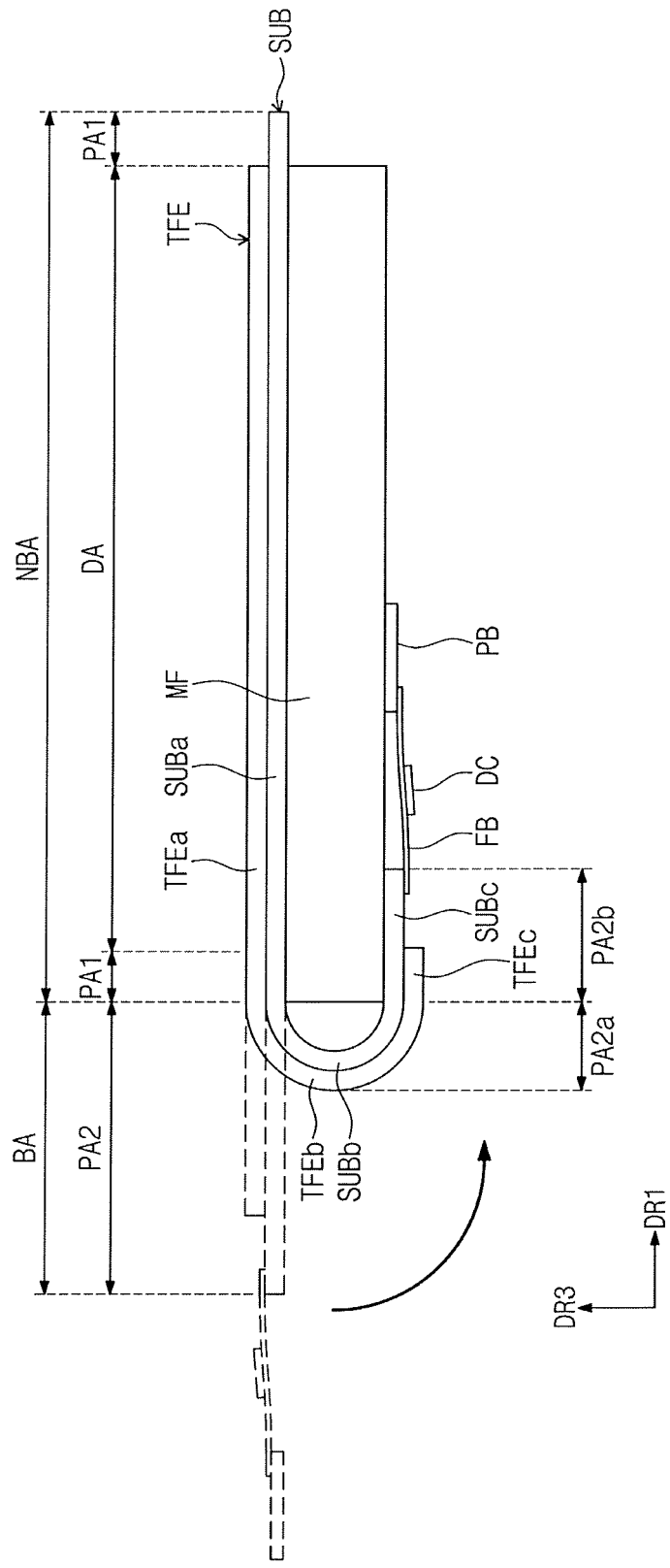
FIG. 5 is a cross-sectional view illustrating a display module having a curved area through a second operation according to an exemplary embodiment of the present inventive concept.

FIG. 4 is a cross-sectional view illustrating a display module according to an exemplary embodiment of the present inventive concept. FIG. 5 is a cross-sectional view illustrating a display module having a curved area through a second operation according to an exemplary embodiment of the present inventive concept.

Referring to FIGS. 4 and 5, a display module DM may include a display panel DP, a supporting member MF, a protection film PF, a main circuit board PB, a connection circuit board FB, a driving chip DC, a bottom chassis BC, and light blocking members SB1 and SB2. The display module DM may further include the input sensing member TS of FIG. 3A. The input sensing members TS may be disposed on the display panel DP. Although the input sensing member TS may be omitted, the input sensing member TS may be disposed on a thin film encapsulation layer TFE.

Referring to FIG. 4, the display panel DP may include a base layer SUB and the thin film encapsulation layer TFE. The thin film encapsulation layer TFE may be disposed on the base layer SUB. Referring to FIG. 3A, the display panel DP may further include the display layer DPS. The display layer DPS may be disposed between the base layer SUB and the thin film encapsulation layer TFE. The thin film encapsulation layer TFE may cover the display layer DPS. The thin film encapsulation layer TFE may be disposed on the base layer SUB.

The supporting member MF may overlap a display area DA. The supporting member MF may support the display panel DP. The supporting member MF may include a first surface, a second surface, and a third surface. The first surface may face the display panel DP. The first surface may be an upper surface of the supporting member MF. The second surface may be opposite the first surface. The second surface may be a lower surface of the supporting member MF. The third surface may be configured to connect the first surface and the second surface. The third surface may be a side surface of the supporting member MF. A shape of the supporting member MF may be variously modified. For example, the supporting member MF may partially or entirely overlap a flat surrounding area PA1; however, exemplary embodiments of the present inventive concept are not limited thereto. For example, the supporting member MF might not overlap the flat surrounding area PA1.

The base layer SUB may include the display area DA, the flat surrounding area PA1, and a bending surrounding area PA2. The flat surrounding area PA1 may be adjacent to this display area DA. The bending surrounding area PA1 may be bent from the flat surrounding area PA1. The flat surrounding area PA1 may be adjacent to a portion of the display area. Alternatively, the flat surrounding area PA1 may be omitted. Hereinafter, the flat surrounding area PA1 may be described as being omitted. Thus, the base layer SUB may include the bending surrounding area PA2 bent from the display area DA.

According to an exemplary embodiment of the present inventive concept, the bending surrounding area PA2 may be bent along a side of the supporting member MF. The bending surrounding area PA2 may include a curved area PA2a and a flat area PA2b. The curved area PA2a may be bent along the side of the supporting member MF. The flat area PA2b may extend from the curved area PA2a. The flat area PA2b may be disposed on a lower surface of the supporting member MF. The flat area PA2b may be substantially flat. The base layer SUB may be divided into a first base portion SUBa, a second base portion SUBb, and a third base portion SUBc. The first base portion SUBa may correspond to the display area DA. The second base portion SUBb may correspond to the curved area PA2a. The third base portion SUBc may correspond to the flat area PA2b. Thus, the third base portion SUBc may be disposed on the lower surface of the supporting member MF.

The thin film encapsulation layer TFE may include a first encapsulation portion TFEa, a second encapsulation portion TFEb, and a third encapsulation portion TFEc. The first encapsulation portion TFEa may be disposed on the display area DA. The second encapsulation portion TFEb may be disposed on the curved area PA2a. The third encapsulation portion TFEc may be disposed on the flat area PA2b. The second encapsulation portion TFEb may have a bent shape along the curved area PA2a. The third encapsulation portion TFEc may partially overlap the flat area PA2b. Alternatively, the third encapsulation portion TFEc may be omitted.

Referring to FIG. 5, as the bending surrounding area PA2 is bent from the display area DA, a non-display area NDA of the display device DD may be entirely reduced. As a result, an entire bezel area of the display device DD may be reduced.

The main circuit board PB may be disposed on the lower surface of the supporting member MF. For one example, the main circuit board PB may be a printed circuit board (PCB). The main circuit board PB may be electrically connected to the display layer DPS of FIG. 3A disposed on the base layer SUB, for example, through the connection circuit board FB. The connection circuit board FB may have a first end connected to the flat surface PA2b. A second end of the connection circuit board FB may be connected to the main circuit board PB. For one example, the connection circuit board FB may be a flexible printed circuit board.

According to an exemplary embodiment of the present inventive concept, the main circuit board PB may output a plurality of driving signals. The plurality of driving signals may be used to display an image. For example, the driving signals may be control signals. The control signals may be provided to the signal lines SGL of FIG. 3B. The data signal provided to the pixels PX may be outputted.

The driving chip DC may be disposed on the connection circuit board FB. Thus, the driving chip DC may be provided as a tape carrier package (TCP) type; however, exemplary embodiments of the present inventive concept are not limited thereto. For example, the driving chip DC may be a chip on glass (COG) type. Thus, the driving chip DC may be disposed on the base layer SUB and may overlap the flat area PA2b. The driving chip DC may respond to the driving signals provided from the main circuit board PB, for example, to generate a plurality of data voltages. The plurality of data voltages may be provided to the display layer DPS.

The bottom chassis BC may be configured to receive each of the display panel DP, the supporting member MF, and the connection circuit board FB.

According to an exemplary embodiment of the present inventive concept, the light blocking member may overlap the curved area PA2a. The light blocking member may include a first light blocking member SB1. The first light blocking member SB1 may contact the thin film encapsulation layer TFE. The first light blocking member SB1 may seal a space between the bottom chassis BC and the thin film encapsulation layer TFE overlapping the curved area PA2a. For example, the first light blocking member SB1 may be a sealing member having a black color.

Since the first light blocking member SB1 may seal the space between the bottom chassis BC and the thin film encapsulation layer TFE overlapping the curved area PA2a, the bent curved area PA2a may be prevented from returning to a substantially flat shape. The first light blocking member SB1 may reduce or prevent light from being emitted from the curved area PA2a to the outside.

According to an exemplary embodiment of the present inventive concept, the thin film encapsulation layer TFE may be disposed on the curved surface PA2a and a portion of the flat area PA2b; however, exemplary embodiments of the present inventive concept are not limited thereto. For example, the thin film encapsulation layer TFE may overlap a non-display area NBA and may be disposed on the base layer SUB. Accordingly, the first light blocking member SB1 may be disposed directly on the curved area PA2a of the base layer SUB. The first light blocking member PA2a may seal a space between the bottom chassis BC and the curved area PA2a.

The light blocking member may include a second light blocking member SB2. The second light blocking member SB2 may overlap the flat surrounding area PA1. For example, the second light blocking member SB2 may have a black color and may be disposed on the base layer SUB.

The protection film PF may overlap each of the display area DA and the non-display area NDA. The protection film may be disposed on the thin film encapsulation layer TFE. The protection film PF may be coupled to the bottom chassis BC. The protection film PF may reduce or prevent each of the first light blocking member SB1 and the second light blocking member SB2 from being separated to the outside. The first light blocking member SB1 and the second light blocking member SB2 may each contact each of the protection film PF and the thin film encapsulation layer TFE.

Figure 6:
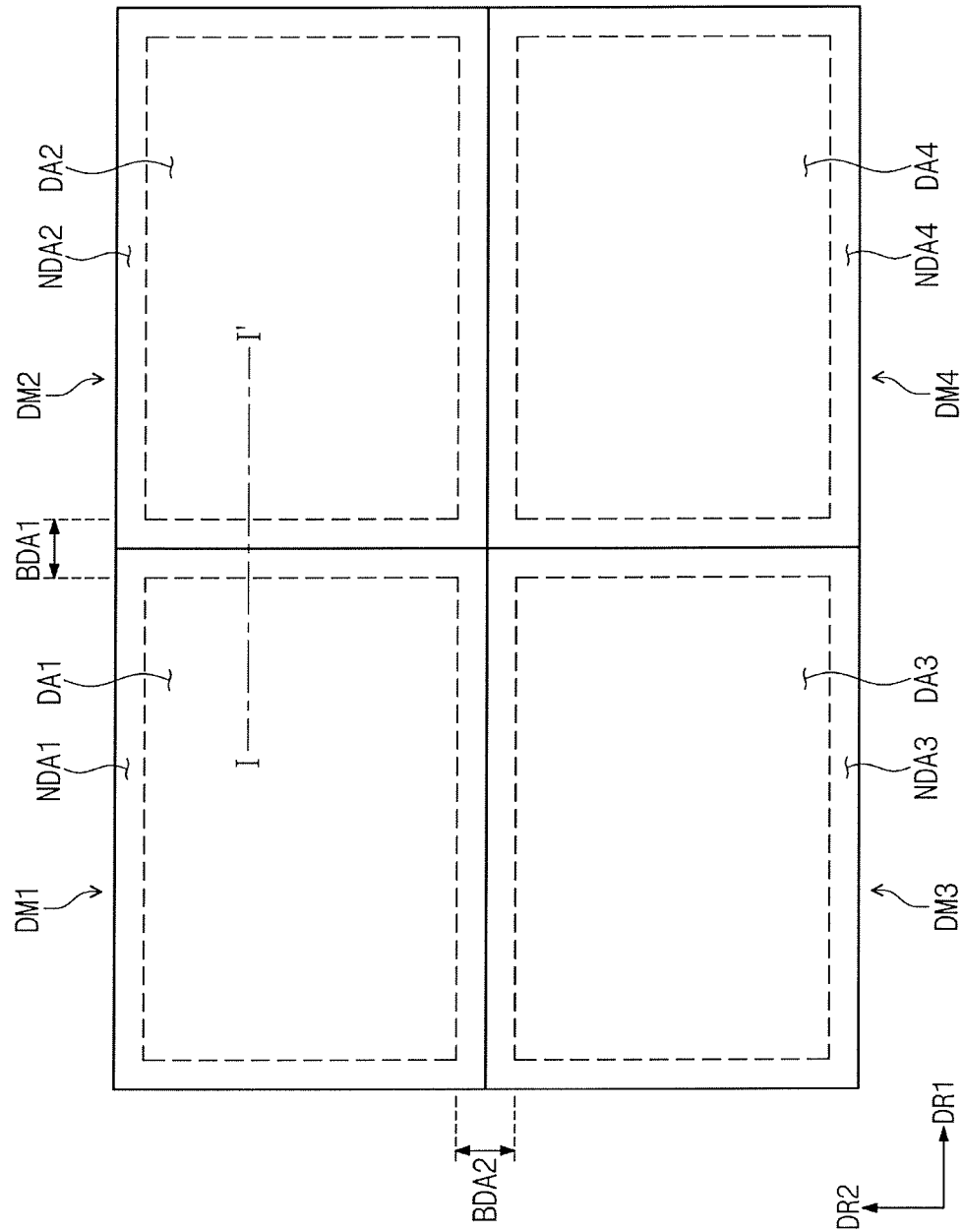
FIG. 6 is a plan view illustrating a display device according to another embodiment of the present inventive concept.
Figure 7B:
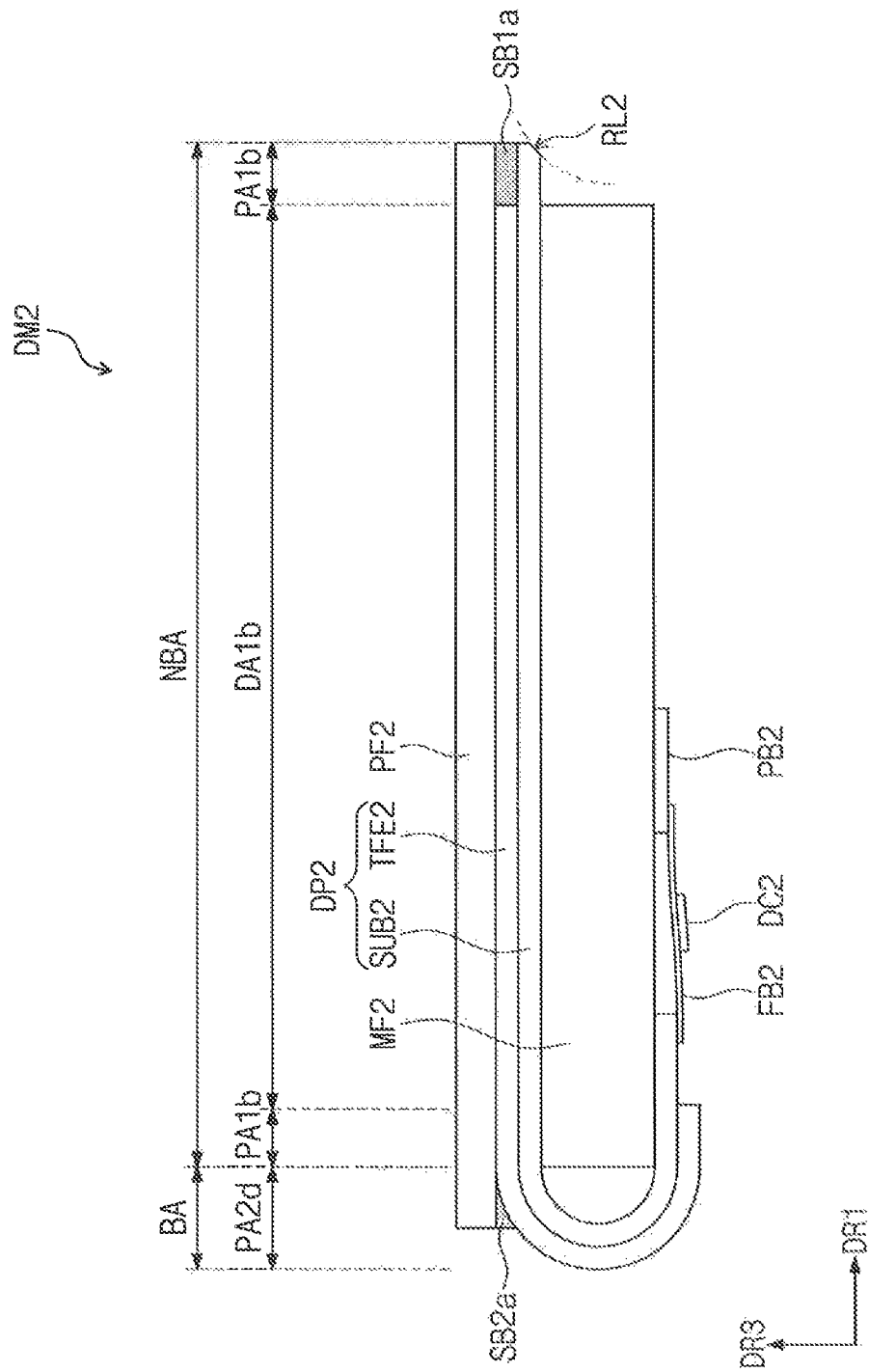
FIG. 7B is a cross-sectional view illustrating a second display module according to an exemplary embodiment of the present inventive concept.

FIG. 6 is a plan view illustrating a display device according to an exemplary embodiment of the present inventive concept. FIG. 7A is a cross-sectional view illustrating a first display module according to an exemplary embodiment of the present inventive concept. FIG. 7B is a cross-sectional view illustrating a second display module according to an exemplary embodiment of the present inventive concept.

Figure 8:
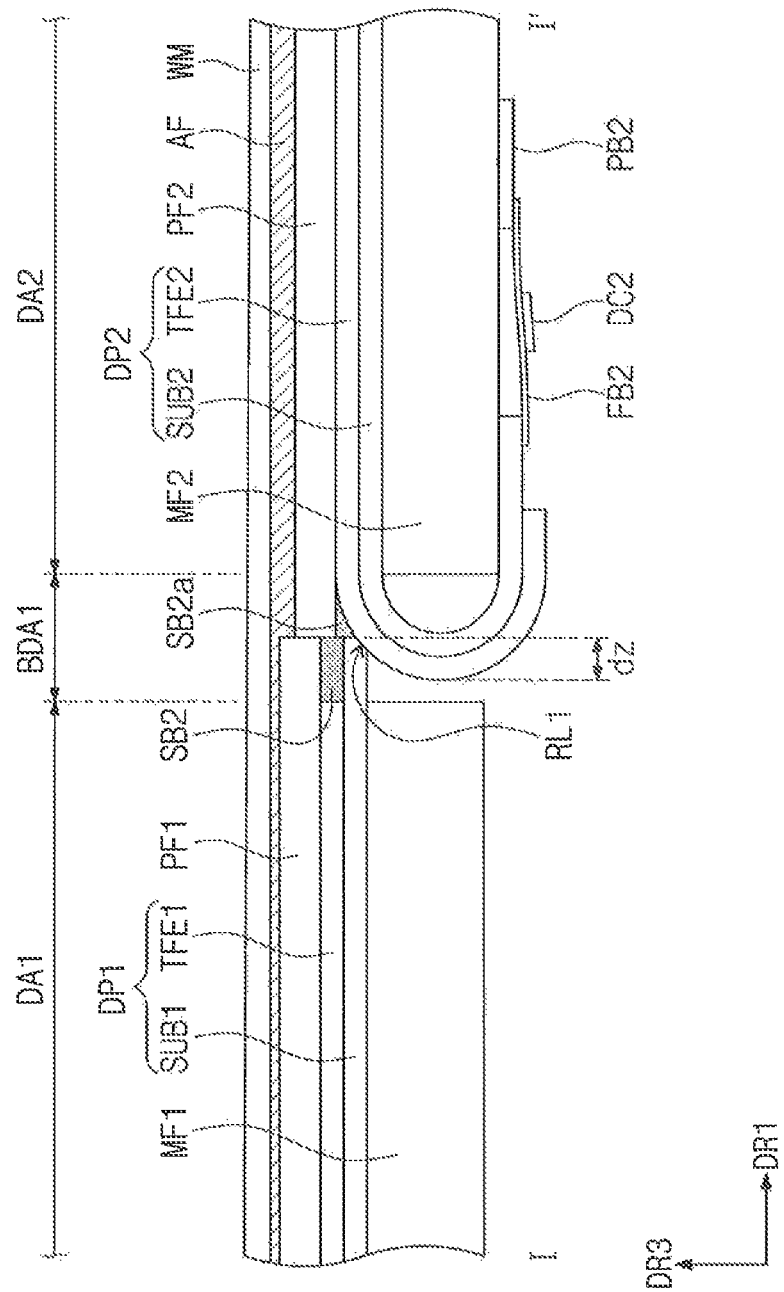
FIG. 8 is a cross-sectional view taken along a line I-I' of FIG. 6 according to an exemplary embodiment of the present inventive concept.

FIG. 8 is a cross-sectional view taken along a line I-I' of FIG. 6 according to an exemplary embodiment of the present inventive concept.

Referring to FIG. 6, a display device DD may include a plurality of display modules. The plurality of display modules may be coupled to each other. As a result, the plurality of display modules may display an image in the display device DD. The display device DD may include first to fourth display modules DM1 to DM4 of FIG. 6.

In the first module DM1, a first display area DA1 and a first non-display area NDA1 may be provided. The first non-display area NDA1 may include a first flat surrounding area and a first bending surrounding area. The first fat surrounding area may be adjacent to the first display area DA1. The first bending surrounding area bent from the first flat surrounding area. The first bending surrounding area may be bent from the first display area DAL The first bending surrounding area might not be bent from the first flat surrounding area.

In the second module DM2, a second display area DA2 and a second non-display area NDA2 may be provided. The second non-display area NDA2 may include a second flat surrounding area and a second bending surrounding area. The second flat surrounding area may be adjacent to the second display area DA2. The second bending surrounding area may be bent from the second flat surrounding area. The second bending surrounding area may be bent from the second display area DA2. The second bending surrounding area might not be bent from the second flat surrounding area.

In the third module DM3, a third display area DA3 and a third non-display area NDA3 may be provided. The third non-display area NDA3 may include a third flat surrounding area and a third bending surrounding area. The third flat surrounding area may be adjacent to the third display area DA3. The third bending surrounding area may be bent from the third flat surrounding area. The third bending surrounding area may be bent from the third display area DA3. The third bending surrounding area might not be bent from the third flat surrounding area.

In the fourth module DM4, a fourth display area DA4 and a fourth non-display area NDA4 may be provided. The fourth non-display area NDA4 may include a fourth flat surrounding area and a fourth bent surrounding area. The fourth flat surrounding area may be adjacent to the fourth display area DA4. The fourth bending surrounding area may be bent from the fourth flat surrounding area. The fourth bending surrounding area may be bent from the fourth display area DA4. The fourth bending surrounding area might not be bent from the fourth flat surrounding area.

A first boundary area BDA1 may be provided between the first display module DM1 and the second display module DM2 in a first direction DR1. Thus, the first boundary area BDA1 may be an area between the first display area DA1 and the second display area DA2. This first boundary area BDA1 may be a bezel area. An image displayed on the bezel area may be viewed from the outside. Thus, the first boundary area BDA1 may be an area in which the first non-display area NDA1 of the first display module DM1 and the second non-display area NDA2 of the second display module DM2 are coupled to each other.

A bezel area may be an area in which the first non-display area NDA1 and the second non-display area NDA1 are combined with each other. Since the bezel area may be provided as the area in which two non-display areas are combined, an image may be viewed to be divided by the bezel area. Therefore, visibility may be deteriorated.

According an exemplary embodiment of the present inventive concept, the first display module DM1 and the second display module DM2 may overlap each other in the first boundary area BDA1. The first non-display area NDA1 of the first display module DM1 may overlap the second non-display area NDA2 of the second display module DM2. As a result, the first boundary area BDA1, which is the bezel area between the first display module DM1 and the second display module DM2, may be entirely reduced. Thus, a view obstruction due to the bezel area being disposed between the first display module DM1 and the second display module DM2 may be reduced.

Referring to FIG. 7A, the first display module DM1 may include a first display panel DP1, a first supporting member MF1, a first main circuit board PB1, a first connection circuit board FB1, a first driving chip DC1, and a first protection film PF1.

The first display module DM1 of FIG. 7A maybe substantially the same as the display module DP of FIG. 4; however, the display panel DP may differ. Thus, repetitive descriptions may be omitted. Hereinafter, the display panel DP will be described in more detail below with reference to FIG. 7A.

The first display panel DP1 may include a first base layer SUB1, a first thin film encapsulation layer TFE1, a first flat surrounding area PA1$a$, and a second bending surrounding area PA2$c$. The first base layer SUB1 may overlap the first display area DA1. The first display panel DP1 may be disposed on an upper surface of the first supporting member MF1. The first thin film encapsulation layer TFE1 may be disposed on the first base layer SUB1.

For example, the first display panel DP1 may includes a first lower surface, a first upper surface, and a first side surface. The first lower surface may face the first supporting member MF1. The first upper surface may be opposite to the first lower surface. The first upper surface may face the first protection film PF1. The first side surface may be configured to connect the first lower surface and the first upper surface to each other.

According to an exemplary embodiment of the present inventive concept, the first display panel DP1 may have a first curved surface RL1. The first curved surface RL1 may overlap the first flat surrounding area PA1$a$. The first curved surface RL1 may connect the first lower surface and the first side surface to each other. At the first flat surrounding area, the first curved surface RL1 may be defined from the lower surface of the base layer SUB1 facing the first supporting member MF1 to the upper surface of the base layer SUB1.

The second display module DM2 of FIG. 7B may be substantially the same as the display module DM of FIG. 4; however, the display panel, the protection film, and the light blocking member may differ. Thus, repetitive descriptions constitutions may be omitted. Hereinafter, the display panel, the protection film, and the light blocking member will be described in more detail below with reference to FIG. 7B.

The second display panel DP2 may include a second base layer SUB2, a second thin film encapsulation layer TFE2, a second flat surrounding area PA1$b$, and a second bending surrounding area PA2$d$. The second base layer substrate SUB2 may overlap a second display area DA1$b$. The second display panel DP2 may be disposed on an upper surface of a second supporting member MF2. The second thin film encapsulation layer TFE2 may be disposed on the second base layer SUB2.

For example, the second display panel DP2 may include a second lower surface, a second upper surface, and a second side surface. The second lower surface may face the second supporting member MF2. The second upper surface may be opposite to the second lower surface. The second upper surface may face a second protection film PF2. The second side surface may be configured to connect the second lower surface and the second upper surface to each other.

According to an exemplary embodiment of the present inventive concept, the second display panel DP2 may have a second curved surface RL2. The second curved surface RL2 may overlap the second flat surrounding area PA1b. The second curved surface RL2 may connect the second lower surface and the second side surface to each other. The second display panel DP2 may omit the second curved surface RL2.

According to an exemplary embodiment of the present inventive concept, the second protection film PF2 may overlap each of the second display area DA1b and the second flat surrounding area PA1b. The second protection film PF2 may be disposed on the second display panel DP2. The second display module DM2 may include a third light blocking member SB1a. The third light blocking member SB1a may overlap the second flat surrounding area PA1b. The third light blocking member SB1a may be disposed on the second display panel DP2. For example, the third light blocking member SB1a may be disposed on the second base layer SUB2. Alternatively, the third light blocking member SB1a may be disposed on the second thin film encapsulation layer TFE2.

According to an exemplary embodiment of the present inventive concept, the second protection film PF2 may overlap each of the second display area DA2, the second flat surrounding area PA1b, and a portion of the second bending surrounding area PA2d. The second protection film PF2 may be disposed on the second display panel DP2. The second display module DM2 may include a third light blocking member SB1a. The third light blocking member SB1a may overlap the second flat surrounding area PA1b. The third light blocking member SB1a may be disposed on the second display panel DP2. The second display module DM2 may also include a fourth light blocking member SB2a. The fourth light blocking member SB2a may overlap a portion of the second bending surrounding area PA2d. The fourth light blocking member SB2a may be disposed on the second display panel DP2.

Referring to FIG. 8, the first curved surface RL1 may be disposed on the upper surface of the second display panel DP2, which overlaps the second bending surrounding area PA2d of the second display module DM2. Thus, the first curved surface RL1 may correspond to a bending curvature of the second bending surrounding area PA2d. Since the first curved surface RL1, which may overlap the first flat surrounding area PA1a, of the first base layer SUB1 may be disposed on the second top surface overlapping the second bending surrounding area PA2d, the first flat surrounding area PA1a may overlap the second bending surrounding area PA2d.

For example, referring to FIG. 8, the first flat surrounding area PA1a and the second bending surrounding area PA2d may overlap each other by a first distance dz in the first direction DR1. When compared to an the existing first boundary area in which the first display module does not overlap the second display module, the first boundary area BDA1 according to an exemplary embodiment of the present inventive concept decrease by the first distance dz in the first direction DR1.

According to an exemplary embodiment of the present inventive concept, when the first flat surrounding area PA1a entirely overlaps the second bending surrounding area PA2d, the second protection film PF2 may overlap each of the second display area DA2 and the second flat surrounding area PA1b.

According to an exemplary embodiment of the present inventive concept, when the first flat surrounding area PA1a partially overlaps the second bending surrounding area PA2d, the second protection film PF2 may overlap each of the second display area DA2, the second flat surrounding area PA1b, and a portion of the second bending surrounding area PA2d. As a result, the fourth light blocking member SB2a may be disposed on a portion of the second bending surrounding area PA2d. The fourth light blocking member SB2a might not overlap the second light blocking member SB2.

Since the first curved surface RL1 may contact the second bending surrounding area PA2d, the first display module DM1 and the second display module DM2 may be tilted toward each other. Therefore, the first protection film PF1 may have a position higher than a positioned of the second protection film PF2 in a third direction DR3. An adhesion member AF may be disposed between the first protection film PF1 and the first display panel DP1. The adhesion member AF may also be disposed between the second protection film PF2 and the second display panel DP2. A portion of the adhesion member AF disposed between the first protection film PF1 and the first display panel DP1 may have a thickness different from a portion of the adhesion member AF disposed between the second protection film PF2 and the second display panel DP2. For example, a thickness of the portion of the adhesion member AF disposed between the first protection film PF1 and the first display panel DP1 may be smaller than a thickness of the portion of the adhesion member AF disposed between the second protection film PF2 and the second display panel DP2.

The window WM may be disposed on the adhesion member AF. As a result, the window WM may cover each of the first display module DM1 and the second display module DM2.

The third display module DM3 and the fourth display module DM4 may each be substantially the same as the first display module DM1 and the second display module DM2. Thus, repetitive descriptions thereof may be omitted.

Referring to FIG. 6, a second boundary area BDA2 may be provided between the first display module DM1 and the third display module DM3 in a second direction DR2. This second boundary area BDA2 may be a bezel area in which an image might not be viewable from the outside. Thus, the second boundary area BDA2 may be an area in which the first non-display area NDA1 of the first display module DM1 and the third non-display area NDA3 of the third display module DM3 are coupled to each other. As a result, the second boundary area BDA2 may be divided into a flat surrounding area of the first non-display area NDA1 and a flat surrounding area of the third non-display area NDA3. The second boundary area BDA2 may include the first flat surrounding area provided in the first display module DM1 and the third flat surrounding area provided in the third display module DM3.

According to an exemplary embodiment of the present inventive concept, the display module may include the display area and the non-display area. The non-display area may include the flat surrounding area and the bending surrounding area. The flat surrounding area may be adjacent to the display area. The bending surrounding area may be bent from the display area. The flat surrounding area and the bending surrounding area may overlap each other in two display modules adjacent to each other. Accordingly, the boundary area between two display modules adjacent to each other may be reduced.

While exemplary embodiments of the present inventive concept have been illustrated and described with reference to the exemplary embodiments thereof, it will be apparent to those of ordinary skill in the art that various changes in form and detail may be made thereto without departing from the spirit and scope of the present inventive concept as defined by the following claims.

What is claimed is:

1. A display device, comprising:
a first display module including a first display area, a first non-display area adjacent to the first display area, a second non-display area bent from the first non-display area, and a curved surface overlapping the first non-display area; and
a second display module including a second display area, a third non-display area adjacent to the second display area, and a fourth non-display area bent from the third non-display area,
wherein the first non-display area overlaps the fourth non-display area where the curved surface and the fourth non-display area contact each other, and
wherein the first non-display area is substantially flat and partially surrounds the first display area, and the third non-display area is substantially flat and partially surrounds the second display area.

2. The display device of claim 1, wherein the first display module comprises a first display panel comprising:
first upper and lower surfaces overlapping each of the first display area, the first non-display area, and the second non-display area;
a first side surface configured to connect the first upper surface and the first lower surface; and
the curved surface overlapping the first non-display area, wherein the curved surface is configured to connect the first lower surface and the first side surface; and
wherein the second display module comprises a second display panel comprising:
second upper and lower surfaces overlapping each of the second display area, the third non-display area, and the fourth non-display area; and
a second side surface configured to connect the second lower surface and the second upper surface,
wherein the curved surface is disposed on the second upper surface and overlaps the fourth non-display area.

3. The display device of claim 2, wherein the first display module further comprises a first light blocking member disposed on the first display panel and overlapping the second non-display area, and a second light blocking member disposed on the first display panel and overlapping the first non-display area, and the second display module further comprises a third light blocking member disposed on the second display panel and overlapping the third non-display area.

4. The display device of claim 3, further comprising a fourth light blocking member disposed on the second display panel overlapping a portion of the fourth non-display area,
wherein the fourth light blocking member does not overlap the second light blocking member.

5. The display device of claim 2, wherein the first display module further comprises a first supporting member overlapping the first display area and configured to support the first display panel, and
the second display module further comprises a second support member overlapping the second display area and configured to support the second display panel.

6. The display device of claim 5, wherein the first display module further comprises a first circuit board disposed on a lower surface of the first supporting member and connected to the first display panel overlapping the second non-display area, and
the second display module further comprises a second circuit board disposed on a lower surface of the second supporting member and connected to the second display panel overlapping the fourth non-display area.

7. The display device of claim 2, wherein the first display module further comprises a first protection film disposed on the first display panel and overlapping each of the first display area, the first non-display area, and the second non-display area, and the second display module further comprises a second protection film disposed on the second panel and overlapping each of the second display area and the third non-display area.

8. The display device of claim 7, wherein the first protection film is disposed above the second protection film in a thickness direction of the first display panel and the second display panel.

9. The display device of claim 7, further comprising an adhesion member disposed on each of the first protection film and the second protection film; and
a window member disposed on the adhesion member.

10. The display device of claim 9, wherein the adhesion member overlapping the first protection film has a thickness different from a thickness of the adhesion member overlapping the second protection member.

11. The display device of claim 2, wherein the first display module further comprises a first input sensing member disposed on the first display area, and
the second display module further comprises a second input sensing member disposed on the second display area.

* * * * *